US011615902B2

(12) United States Patent
Orimo et al.

(10) Patent No.: US 11,615,902 B2
(45) Date of Patent: Mar. 28, 2023

(54) SOFT MAGNETIC ALLOY POWDER AND METHOD FOR MANUFACTURING SAME, AS WELL AS COIL COMPONENT MADE FROM SOFT MAGNETIC ALLOY POWDER AND CIRCUIT BOARD CARRYING SAME

(71) Applicant: TAIYO YUDEN CO., LTD., Tokyo (JP)

(72) Inventors: Yoko Orimo, Takasaki (JP); Shinsuke Takeoka, Takasaki (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 386 days.

(21) Appl. No.: 16/798,870

(22) Filed: Feb. 24, 2020

(65) Prior Publication Data
US 2020/0279676 A1    Sep. 3, 2020

(30) Foreign Application Priority Data

Feb. 28, 2019 (JP) .............................. JP2019-036937
Nov. 18, 2019 (JP) .............................. JP2019-207605

(51) Int. Cl.
| H01F 1/147 | (2006.01) |
| H01F 27/255 | (2006.01) |
| H01F 27/28 | (2006.01) |
| H05K 1/18 | (2006.01) |
| C22C 38/18 | (2006.01) |
| C22C 38/06 | (2006.01) |
| C22C 38/02 | (2006.01) |
| B22F 1/00 | (2022.01) |
| B22F 1/142 | (2022.01) |

(52) U.S. Cl.
CPC .......... *H01F 1/14791* (2013.01); *B22F 1/142* (2022.01); *C22C 38/02* (2013.01); *C22C 38/06* (2013.01); *C22C 38/18* (2013.01); *H01F 1/14766* (2013.01); *H01F 27/255* (2013.01); *H01F 27/2804* (2013.01); *H05K 1/181* (2013.01); *B22F 2301/35* (2013.01); *C22C 2202/02* (2013.01); *H01F 2027/2809* (2013.01); *H05K 2201/1003* (2013.01)

(58) Field of Classification Search
None
See application file for complete search history.

(56) References Cited

FOREIGN PATENT DOCUMENTS

| JP | 2006049625 A | 2/2006 |
| JP | 2018182040 A | 11/2018 |
| JP | 6439884 B1 | 12/2018 |
| JP | 2019121738 A | 7/2019 |

*Primary Examiner* — Anthony M Liang
(74) *Attorney, Agent, or Firm* — Law Office of Katsuhiro Arai

(57) ABSTRACT

A soft magnetic alloy powder contains Fe, Si, and at least one of Cr and Al, as constituent elements, wherein, on the surface of each grain constituting the alloy powder, an oxide film is provided which is such that: it contains Si, as well as at least one of Cr and Al, as constituent elements; these elements are contained at higher percentages by mass than those in the alloy part inside the grain; and the content of Si, expressed in percentage by mass, is higher than the total content of Cr and Al. The soft magnetic metal powder can achieve a higher filling rate.

6 Claims, 8 Drawing Sheets

Cross-Section A-A

SOFT MAGNETIC ALLOY POWDER AND METHOD FOR MANUFACTURING SAME, AS WELL AS COIL COMPONENT MADE FROM SOFT MAGNETIC ALLOY POWDER AND CIRCUIT BOARD CARRYING SAME

CROSS-REFERENCE TO RELATED APPLICATIONS

The present application claims priority to Japanese Patent Application No. 2019-036937, filed Feb. 28, 2019 and 2019-207605, filed Nov. 18, 2019, the disclosure of which is incorporated herein by reference in its entirety including any and all particular combinations of the features disclosed therein.

BACKGROUND

Field of the Invention

The present invention relates to a soft magnetic alloy powder and a method for manufacturing the same, as well as a coil component made from such soft magnetic alloy powder and a circuit board carrying the same.

Description of the Related Art

In recent years, coil components for applications such as those where they must carry high current, are facing calls for size reduction as well as further high electrical current amplification. Since high electrical current amplification of a coil component requires constituting its core using a magnetic material having magnetic-saturation resistance to current, there has been a growing use of iron-based metal magnetic materials—instead of ferritic materials—as the magnetic materials for this purpose.

Particularly when forming a small coil component, an atomized powder is often used as it increases the filling rate of a soft magnetic metal material in powder form. This is because an atomized powder, which is a powder obtained by blowing water, inert gas, or other fluid onto trickling streams of molten metal to scatter and solidify the metal, provides grains which are relatively closer in shape to a sphere, and small in size.

In the meantime, magnetic metal materials in powder form are such that the individual grains constituting the powder themselves have low insulating resistance, and accordingly they are often used with the surface of each constitutive grain covered with an insulating film for the purpose of adding insulating property.

Known, among the methods for forming an insulating film on the surface of each grain constituting a soft magnetic metal powder, is one whereby a material that will form the film is attached to the grain surface. For example, Patent Literature 1 reports coating a soft magnetic metal powder with a treatment solution containing titanium alkoxide and silicone alkoxide to form a film constituted by a polymer thereof.

Also, oxidation-treating the powder surface is another known method for forming an insulating film on the surface of each grain constituting a soft magnetic metal powder (Patent Literature 2).

Reported, as a specific method of such oxidation process, is one whereby a Fe-1% Si atomized alloy grain that has been prepared to have an average grain size of 100 μm is oxidation-reacted for 2 hours at 450° C. in an atmosphere of very low oxygen concentration created by mixing water vapor into nitrogen gas and adjusting the relative humidity to 100% (at room temperature), thereby forming a $SiO_2$ oxide film of 5 nm in film thickness on the grain surface (Patent Literature 3).

BACKGROUND ART LITERATURES

[Patent Literature 1] Japanese Patent Laid-open No. 2018-182040
[Patent Literature 2] Japanese Patent No. 6439884
[Patent Literature 3] Japanese Patent Laid-open No. 2006-49625

SUMMARY

In recent years, a trend for higher operating frequencies of coil components is driving powder size reduction of soft magnetic metal materials in powder form that constitute these components. For this reason, use of fine powders of 5 μm or less in average grain size is increasing. These soft magnetic metal powders constituted by fine grains must also achieve a high filling rate, while preventing insulation deterioration that would otherwise result from a higher filling rate.

However, the conventional soft magnetic metal powders, even the atomized powders as mentioned above, aggregate easily in fine powder form; as a result, it is difficult to achieve a high filling rate through standard processes. To compensate for this, special processes are needed, such as applying high pressure at the time of compacting, which presents a problem in that the manufacturing of a magnetic body becomes cumbersome. Furthermore, applying high pressure at the time of compacting causes the soft magnetic metal grains to deform, which presents another problem of possible breakage of the insulating film that has been formed on the surface and consequent drop in insulating property.

In light of the above, an object of the present invention is to solve the aforementioned problems and provide a soft magnetic metal powder that can achieve a higher filling rate.

After conducting various studies to solve the aforementioned problems, the inventor of the present invention found that the problems could be solved by using a soft magnetic metal powder of a specific composition, and also forming an oxide film of a specific composition on the surface of each grain constituting the metal powder, and therefore completed the present invention.

To be specific, the first embodiment of the present invention to solve the aforementioned problems is a soft magnetic alloy powder containing Fe, Si, and at least one of Cr and Al, as constituent elements, wherein such soft magnetic alloy powder is characterized in that, on the surface of each grain constituting the alloy powder, an oxide film is provided in such a way that: it contains Si, as well as at least one of Cr and Al, as constituent elements; these elements are contained at higher percentages by mass than those in the alloy part inside the grain; and the content of Si, expressed in percentage by mass, is higher than the total content of Cr and Al.

Also, the second embodiment of the present invention is a method for manufacturing soft magnetic alloy powder, characterized in that a material powder of soft magnetic alloy containing Fe, Si, and at least one of Cr and Al, as constituent elements—where the content of Si, expressed in percentage by mass, is higher than the total content of Cr and Al—is heat-treated at a temperature of 600° C. or above in an atmosphere of 5 to 500 ppm in oxygen concentration.

Also, the third embodiment of the present invention is a coil component that includes a coil part constituted by a metal conductor and a magnetic base body containing soft magnetic alloy grains, wherein the soft magnetic alloy grains are soft magnetic alloy grains constituting the soft magnetic alloy powder pertaining to the first embodiment.

Furthermore, the fourth embodiment of the present invention is a circuit board carrying the coil component pertaining to the third embodiment.

According to the present invention, a soft magnetic alloy powder can be provided that can achieve a higher filling rate.

DETAILED DESCRIPTION OF EMBODIMENTS

Figure 1:
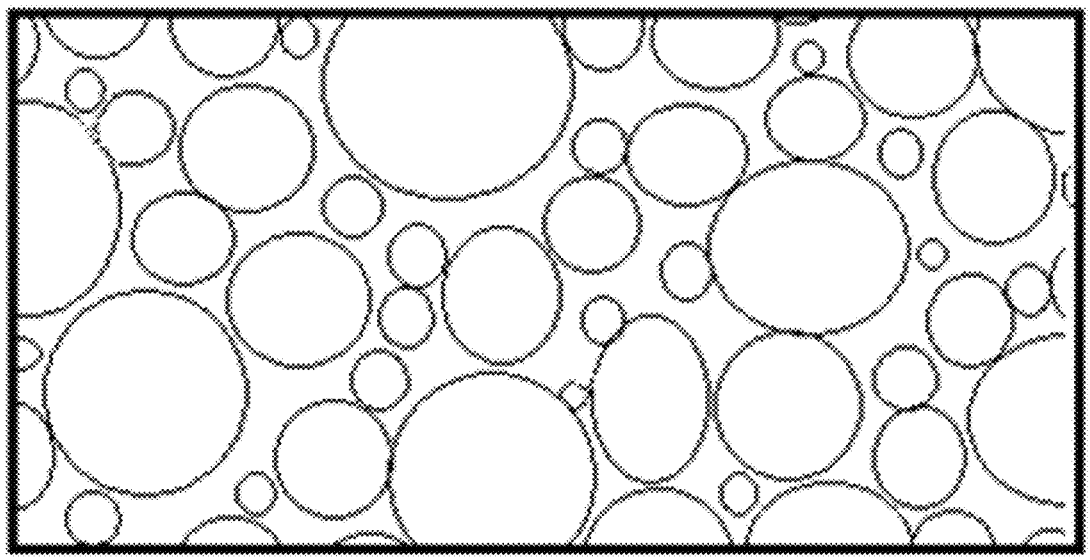
FIG. 1 is a drawing explaining an example of grain shapes in a soft magnetic alloy powder pertaining to an embodiment of the present invention

The constitutions as well as operations and effects of the present invention are explained below, together with the technical ideas, by referring to the drawings. It should be noted, however, that the mechanisms of operations include estimations and whether they are right or wrong does not limit the present invention in any way. Also, of the components in the embodiments below, those components not described in the independent claims representing the most generic concepts are explained as optional components. It should be noted that a description of numerical range (description of two values connected by "to") is interpreted to include the described values as the lower limit and the upper limit.

Soft Magnetic Alloy Powder

The soft magnetic alloy powder pertaining to the first embodiment of the present invention (hereinafter also referred to simply as "first embodiment") contains Fe, Si, and at least one of Cr and Al, as constituent elements. Additionally, provided on the surface of each grain constituting the alloy powder is an oxide film which contains Si, as well as at least one of Cr and Al, as constituent elements, where these elements are contained at higher percentages by mass than those in the alloy part inside the grain and the content of Si, expressed in percentage by mass, is higher than the total content of Cr and Al. An example of grain shapes in the soft magnetic alloy powder pertaining to the first embodiment is illustrated schematically in FIG. 1.

Studies conducted by the inventor of the present invention found a possibility of the conventional soft magnetic metal powders having minute concavities and convexities on the surface of each constitutive grain as a result of formation of an insulating layer or natural oxidation. This is probably why achieving a high filling rate is difficult with these powders, even though their grain shape is spherical, because large inter-grain frictions due to these concavities and convexities lead to insufficient flowability.

By contrast, the aforementioned first embodiment ensures excellent flowability, probably because the oxide film on the grain surface is rich in Si and therefore provides a smooth surface having a glass-like microstructure. Furthermore, because the percentage by mass of Cr or Al in the oxide film is higher than that in the alloy part, natural oxidation is restrained and the oxide film structure is retained, allowing for maintenance of this surface condition even after changes in the environment, etc.

Additionally, in the first embodiment, static electricity on the grain surface is restrained by the oxide film having the aforementioned characteristics and therefore the grains do not aggregate easily with each other, which is likely contributing to flowability, as well.

The first embodiment contains Fe, Si, and at least one of Cr and Al, as constituent elements.

The composition of the alloy part of the soft magnetic alloy powder is not limited in any way so long as the aforementioned requirement is met, and it may be, for example, one where Si is contained by 1 to 10 percent by mass, Cr, if contained, is contained by 0.5 to 5 percent by mass, Al, if contained, is contained by 0.2 to 3 percent by mass, and the remainder consists of Fe and unavoidable impurities (including, e.g., oxygen, hydrogen, nitrogen and unavoidable metal element impurities). To obtain particularly excellent magnetic characteristics by restraining segregation of Cr or Al in the alloy part, the total quantity of Cr and Al is adjusted preferably to 4 percent by mass or less, or more preferably to 2 percent by mass or less. Furthermore, if the alloy part contains Al, then it is particularly preferable that its content is adjusted to 1 percent by mass or less, because Al is more easily oxidized than Cr on the grain surface. It should be noted that, needless to say, the alloy part may contain elements other than those mentioned above.

The grain size of the soft magnetic alloy powder is not limited in any way, either, and the average grain size calculated from the granularity distribution measured on a volume basis (median diameter ($D_{50}$)) may be adjusted to 0.5 to 30 μm, for example. Preferably the average grain size is adjusted to 1 to 10 μm. This average grain size may be measured using, for example, a granularity distribution measuring device that utilizes the laser diffraction/scattering method.

The first embodiment is such that, on the surface of each grain constituting the alloy powder, an oxide film is provided which contains Si, as well as at least one of Cr and Al, as constituent elements, where these elements are contained at higher percentages by mass than those in the alloy part inside the grain. Because the oxide film contains more Si than does the alloy part, the insulating property of the film itself can be increased. In addition, the smoothness of the oxide film surface increases, which makes the insulating property less prone to dropping due to minute concavities, achieves sufficient insulating property with a small thickness, and improves the flowability of the soft magnetic alloy powder. Also, because the oxide film contains more Cr or Al than does the alloy part, the alloy part is restrained from oxidizing further due to arrival of oxygen at the alloy part, which in turn improves the stability of the film.

Presence of such oxide film can increase the insulation of magnetic bodies (cores), winding components, and multilayer components using the first embodiment.

Here, the percentage by mass of each element in the alloy part and oxide film is measured by the following method. Using an X-ray photoelectron spectrometer (PHI Quantera II, manufactured by ULVAC-PHI, Inc.), the content percentages (atomic %) of iron (Fe), silicon (Si), oxygen (O), chromium (Cr), and aluminum (Al) are measured at the surface of the grain constituting the soft magnetic alloy powder and then the grain surface is sputtered, and these steps are repeated to obtain the distribution of each element in the depth direction (diameter direction) of the grain. The measurement of content percentage of each element is performed at depth increments of 5 nm, based on a detection area of 100 μmφ, using the monochromatized AlKα ray as an X-ray source. Also, the sputtering conditions are such that, based on the use of argon (Ar) as a sputtering gas, the applied voltage is 2.0 kV and the sputtering rate is approx. 5 nm/min (equivalent $SiO_2$ value). On the Fe concentration distribution (percent by atom) obtained by the measurement, the section between measuring points where the concentration difference between the measuring points drops to less than 1 percent by atom for the first time, as viewed from the grain surface side, is defined as the boundary between the alloy part and the oxide film. Then, the percentage by mass of each element (percent by mass) is calculated for the oxide film representing the area shallower than the boundary and for the alloy part representing the area deeper than the boundary. It should be noted that, if the composition of the soft magnetic alloy powder is known, then the percentage by mass of each element calculated based on the known composition may be used as the percentage by mass of each element in the alloy part.

In the first embodiment, the content of Si, expressed in percentage by mass, is higher than the total content of Cr and Al in the oxide film. Because the oxide film is rich in Si, a smooth surface having a glass-like microstructure is obtained, and the soft magnetic alloy powder constituted by grains with such feature exhibits excellent flowability.

The percentage of Si present in the oxide film can be increased by raising the composition ratio of Si in the soft magnetic alloy powder or lowering the heat treatment temperature.

As for the aforementioned oxide film, preferably the ratio of the mass of Si to the total mass of Cr and Al (Si/(Cr+Al)), at the topmost surface, is 1 to 10. If the ratio is 1 or higher, the film will have a smoother surface having fewer minute concavities and convexities. If the ratio is 10 or lower, on the other hand, excessive oxidation is restrained and the film stability will improve further, even though the oxide film is thin. The aforementioned ratio is preferably 8 or lower, or more preferably 6 or lower. This way, such surface condition can be maintained, even when heat treatment is applied.

Here, the ratio of the mass of Si to the total mass of Cr and Al (Si/(Cr+Al)), at the topmost surface of the oxide film, is calculated from the data measured before sputtering (initially) in the aforementioned measurement of the percentage by mass of each element in the alloy part and oxide film.

In the first embodiment, preferably the relationship between the specific surface area S ($m^2/g$) and the average grain size $D_{50}$ (μm) satisfies Formula (1) below.

[Math. 1]

$$\log S \leq -0.98 \log D_{50} + 0.34 \quad (1)$$

This formula is derived based on the empirical rule that the common logarithm of specific surface area S ($m^2/g$), and the common logarithm of average grain size $D_{50}$ (μm), have a linear relationship. Since the value of specific surface area of a powder is affected not only by the surface concavities and convexities of the grains constituting the powder, but also by the sizes of the grains, it cannot be asserted that a powder with a smaller value of specific surface area is constituted by smooth grains having fewer surface concavities and convexities. Accordingly, in the first embodiment, by the Formula (1) above, the impact of the surface condition of the oxide film on the grain, and the impact of the grain size, on the specific surface area, are isolated and a soft magnetic alloy powder having a smaller specific surface area due to the former impact is considered to have a smooth surface with fewer concavities and convexities. When the relationship of S and $D_{50}$ satisfies Formula (1) above, a powder of excellent flowability will be obtained.

The specific surface area S ($m^2/g$) can be decreased further by increasing the percentage of Si present in the oxide film on the grain surface and reducing the surface concavities and convexities of the oxide film. With an oxide film having fewer surface concavities and convexities, insulation can be maintained with a smaller film thickness, which is desired. The percentage of Si present in the oxide film on the grain surface can be increased, as mentioned above, by raising the composition ratio of Si in the soft magnetic alloy powder or lowering the heat treatment temperature. To be specific, the relationship between the specific surface area S ($m^2/g$) and the average grain size $D_{50}$ (μm) preferably satisfies Formula (2) below, or more preferably satisfies Formula (3) below.

[Math. 2]

$$\log S \leq -0.98 \log D_{50} + 0.30 \quad (2)$$

[Math. 3]

$$\log S \leq -0.98 \log D_{50} + 0.25 \quad (3)$$

Here, the specific surface area S is measured/calculated with a fully-automated specific surface-area measuring device (Macsorb, manufactured by MOUNTECH Co., Ltd.) using the nitrogen gas adsorption method. First, the measurement sample is deaerated in a heater, after which nitrogen gas is adsorbed and desorbed onto/from the measurement sample, to measure the adsorbed nitrogen quantity. Next, the monomolecular layer adsorption quantity is calculated from the obtained adsorbed nitrogen quantity using the BET 1-point method, and from this value, the surface area of the sample is derived using the area occupied by one nitrogen atom and the value of Avogadro's number. Lastly, the obtained surface area of the sample is divided by the mass of the sample, to obtain the specific surface area S of the powder.

Also, the average grain size $D_{50}$ is measured/calculated with a granularity distribution measuring device (LA-950, manufactured by Horiba, Ltd.) that utilizes the laser diffraction/scattering method. First, water is put in a wet flow cell as a dispersion medium, and the powder that has been fully crushed beforehand is introduced to the cell at a concentration that allows appropriate detection signals to be obtained, in order to measure the granularity distribution. Next, the median diameter is calculated from the obtained granularity distribution, and this value is defined as the average grain size $D_{50}$.

In the first embodiment, preferably the percentage by mass of Si at the topmost surface of the oxide film is 5 times or higher than that in the alloy part, and the percentage by mass of Cr or Al at the topmost surface of the oxide film is 3 times or higher than that in the alloy part. By adjusting the percentages by mass this way, more excellent flowability can be obtained.

Also, in the first embodiment, preferably all of the elements contained in the alloy part, among Si, Cr, and Al, are contained throughout the oxide film. That these elements are contained throughout the oxide film indicates that the oxide film has been formed as a result of diffusion of the components in the alloy part. The soft magnetic alloy powder whose oxide film has been formed through this process is such that, within the grains constituting the powder, each element is distributed continuously from the inside of the grain to the outer periphery face of the grain, and therefore any stress generating inside the grain can be reduced. This allows for restraint of drop in the magnetic permeability of the grain itself.

Here, that all of the elements contained in the alloy part, among Si, Cr, and Al, are contained throughout the oxide film, can be confirmed by the detection of each of all such elements at all measuring points that are positioned in the area determined as the oxide film, in the distribution of each element in the depth direction (diameter direction) obtained by the aforementioned measurement of percentage by mass of each element in the alloy part and oxide film.

To obtain a soft magnetic alloy powder where all of the elements contained in the alloy part, among Si, Cr, and Al, are contained throughout the oxide film, it is effective, as described below, to heat-treat the material powder of soft magnetic alloy in a low-oxygen atmosphere (approx. 5 to 500 ppm or lower). Use of such oxidizing atmosphere restrains sudden oxidation reaction. As a result, the elements that oxidize more easily than Fe can be selectively oxidized. In particular, oxidation of Si can be promoted as an element that oxidizes more easily than Fe. Also, use of any lower-oxygen atmosphere, while it can achieve a similar oxidation reaction, requires a longer heat treatment period and also tends to limit the range in which oxygen is supplied, which can cause the oxidation reaction to vary due to grain-grain contact or absence thereof. For this reason, preferably the aforementioned low-oxygen atmosphere is used.

Furthermore, in the first embodiment, preferably the thickness of the oxide film is 10 to 50 nm. By adjusting the thickness of the oxide film to 10 nm or more, the minute concavities and convexities in the alloy part are covered and a smooth surface can be formed. In addition, high insulating property can be achieved. More preferably the thickness of the oxide film is 20 nm or more. This way, the ratio of Si on the oxide film surface can be increased further. Additionally, insulating property can be maintained even when flaws are created in the oxide film, when the magnetic body is formed, as a result of compression-molding accompanying pressure application. On the other hand, adjusting the thickness of the oxide film to 50 nm or less allows for restraint of drop in the smoothness of the grain surface that would otherwise be caused by uneven film thickness. In addition, high magnetic permeability can be obtained when the magnetic body is formed. More preferably the thickness of the oxide film is 40 nm or less.

Here, the thickness of the oxide film is calculated by observing a cross section of magnetic grains constituting the soft magnetic alloy powder using a scanning transmission electron microscope (STEM) (JEM-2100F, manufactured by JEOL Ltd.), measuring the thickness of the oxide film as recognized by a contrast (brightness) difference (attributed to different compositions) from the alloy part inside the grain, at 10 locations on different grains at a magnification of 500,000 times, and then averaging the results.

Method for Manufacturing Soft Magnetic Alloy Powder

The method for manufacturing soft magnetic alloy powder pertaining to the second embodiment of the present invention (hereinafter also referred to simply as "second embodiment") is characterized in that a material powder of soft magnetic alloy containing Fe, Si, and at least one of Cr and Al, as constituent elements—where the content of Si, expressed in percentage by mass, is higher than the total content of Cr and Al—is heat-treated at a temperature of 600° C. or above in an atmosphere of 5 to 500 ppm in oxygen concentration.

The material powder used in the second embodiment contains Fe, Si, and at least one of Cr and Al, as constituent elements, where the content of Si, expressed in percentage by mass, is higher than the total content of Cr and Al.

Because the material powder contains at least one of Cr and Al, excessive formation of oxide film can be restrained during the heat treatment mentioned below. This makes it possible to stabilize the thickness of the oxide film.

Also, that the material powder contains more Si than the total of Cr and Al allows the oxide film to be formed on the surface of each grain constituting the alloy powder as a result of the heat treatment mentioned below, to have a higher percentage by mass of Si content than that of the total content of Cr and Al, which ensures insulation even when the thickness of the oxide film is small. In addition, oxidation of Cr and Al during the heat treatment mentioned below can be restrained, which also allows for reduction in the thickness of the oxide film. Furthermore, the oxide film can be obtained as one having fewer minute concavities and convexities, which in turn provides for a powder with excellent flowability.

Preferably the relationship between the total mass of Cr and Al and the mass of Si is such that the ratio of the two (Si/(Cr+Al)) is 2 or greater, from the viewpoint that this can restrain oxidation of Cr or Al, or Fe. This way, an oxide film having a very small Fe percentage and a high Si percentage can be formed as a result.

The composition of the material powder to be used is not limited in any way so long as the aforementioned requirements are met; for example, Si may be contained by 1 to 10 percent by mass, Cr, if contained, is contained by 0.5 to 5 percent by mass, Al, if contained, is contained by 0.2 to 3 percent by mass, and the remainder consists of Fe and unavoidable impurities (including, e.g., oxygen, hydrogen, nitrogen and unavoidable metal element impurities). To make the oxide film formed on the grain surface have a higher percentage by mass of Si content compared to that of the total content of Cr and Al, preferably the total quantity of Cr and Al is adjusted to 4 percent by mass or less. This also reduces the concavities and convexities to ensure smoothness. Additionally, to obtain particularly excellent magnetic properties by suppressing the reaction of Cr or Al with oxygen relative to the reaction of Si with oxygen in the alloy part, preferably the total quantity of Cr and Al is adjusted to 2 percent by mass or less. Furthermore, if the alloy part contains Al, then it is particularly preferable that its content is adjusted to 1 percent by mass or less, because Al diffuses more easily to the grain surface than does Cr. It should be noted that, needless to say, the alloy part may contain elements other than those mentioned above.

The grain size of the material powder is not limited in any way, either, and the average grain size calculated from the granularity distribution measured on a volume basis (median diameter ($D_{50}$)) may be adjusted to 0.5 to 30 μm, for example. Preferably the average grain size is adjusted to 1 to 10 μm. This average grain size may be measured using, for example, a granularity distribution measuring device that utilizes the laser diffraction/scattering method.

In the second embodiment, the material powder is heat-treated in an atmosphere of 5 to 500 ppm in oxygen concentration. Adjusting the oxygen concentration of the heat treatment atmosphere to 5 ppm or higher causes the surfaces of individual grains constituting the material powder to be oxidized and oxide films with smooth surface to be formed at sufficient thicknesses. On the other hand, adjusting the oxygen concentration of the heat treatment atmosphere to 500 ppm or lower suppresses excessive oxidation of Cr and Al and allows smooth, Si-rich oxide films to be formed on the surfaces of individual grains constituting the material powder; as a result, a soft magnetic alloy powder of excellent flowability will be obtained and the magnetic body manufactured from the alloy powder will have excellent magnetic properties. The oxygen concentration of the heat treatment atmosphere is preferably 400 ppm or lower, or more preferably 300 ppm or lower. Also, if the material powder contains Al, then adjusting the oxygen concentration of the heat treatment atmosphere to 50 ppm or lower is yet more preferable, because Al oxidizes more easily than Cr.

The heat treatment temperature is adjusted to 600° C. or above. Adjusting the heat treatment temperature to 600° C. or above allows the respective elements of Si, Cr, and Al to diffuse sufficiently at the surfaces of individual grains constituting the material powder, so that highly-stable oxide films with smooth surface can be formed. The heat treatment temperature is preferably 700° C. or above, or more preferably 750° C. or above. The upper limit of heat treatment temperature, although not limited in any way, is preferably 900° C. or below, or more preferably 850° C. or below, or yet more preferably 800° C. or below, from the viewpoint of suppressing oxidation of Fe and excessive oxidation of Cr and Al, and thereby obtaining a magnetic body having excellent magnetic properties. Particularly, from the viewpoint of promoting oxidation of Si while suppressing oxidation of Fe, a temperature higher than 700° C. but lower than 850° C. is preferred. In this case, the thinnest possible oxide film that ensures insulating property can be achieved.

The holding time at the heat treatment temperature, although not limited in any way, is preferably 30 minutes or more, or more preferably 1 hour or more, from the viewpoint of achieving a sufficient oxide film thickness. From the viewpoint of completing the heat treatment quickly and thereby improving productivity, on the other hand, the heat treatment period is adjusted preferably to 5 hours or less, or more preferably to 3 hours or less.

According to the second embodiment, the concentrations of Si, Cr, and Al will increase, over the levels before the heat treatment, at the topmost surface of each grain constituting the soft magnetic alloy powder in which they are contained. Here, assume that the concentrations of Si, Cr, and Al at the topmost surface of each grain constituting the material soft magnetic alloy powder, indicated in percent by mass, are given by $[Si_{material\ powder}]$, $[Cr_{material\ powder}]$ and $[Al_{material\ powder}]$, respectively, while the concentrations of Si, Cr, and Al at the topmost surface of each grain constituting the soft magnetic alloy powder, indicated in percent by mass, are given by $[Si_{alloy\ powder}]$, $[Cr_{alloy\ powder}]$ and $[Al_{alloy\ powder}]$, respectively; in this case, preferably the heat treatment is performed so that $\{([Cr_{alloy\ powder}]+[Al_{alloy\ powder}])/([Cr_{material\ powder}]+[Al_{material\ powder}])\} > ([Si_{alloy\ powder}]/[Si_{material\ powder}])$ is satisfied, or specifically, the percentage of increase in the total quantity of Cr and Al becomes higher than the percentage of increase in the quantity of Si at the topmost grain surface due to the heat treatment. By performing the heat treatment this way, a soft magnetic alloy powder with a highly-stable oxide film can be obtained.

Here, the concentrations of the respective elements at the topmost surfaces of the grains constituting the material powder and soft magnetic alloy powder, are based on the results of the aforementioned topmost grain surface analysis using an X-ray photoelectron spectrometer.

The heat treatment in the second embodiment may be a batch process or flow process. Examples of a flow process include a method whereby multiple heat-resistant containers carrying the material powder of soft magnetic alloy are introduced into a tunnel furnace either intermittently or successively, to have them pass through an area, which is kept at a prescribed atmosphere and a prescribed temperature, over a prescribed period of time.

In the second embodiment, a Si-containing compound may be attached to the surface of the grain constituting the material powder of soft magnetic alloy prior to the heat treatment. Attaching a Si-containing compound allows a Si-rich oxide film to be formed thickly through the heat treatment, which in turn improves the insulating property between adjacent soft magnetic alloy grains when the magnetic body is formed, and consequently core loss can be reduced.

The type of the Si-containing compound to be used, and the method for attaching the compound, are not limited in any way; however, a method whereby a solution containing tetraethoxy silane (TEOS) is mixed under agitation in a dispersion liquid of the material powder, followed by solid-liquid separation and drying, is preferred from the viewpoint that this allows for even attachment of the Si-containing compound so that grains with smooth surface can be obtained through the heat treatment.

According to the first embodiment and second embodiment mentioned above, a soft magnetic alloy powder of excellent flowability, which has grain shapes like those illustrated in FIG. 1, is obtained. This soft magnetic alloy powder offers an excellent ease of handling as well as a high bulk density, which allows for an increase in the filling rate when the powder is compacted to manufacture a magnetic body. Also, the soft magnetic alloy powder has a small surface area, which means that, when it is mixed with a resin or other binder, the viscosity of the resulting mixture remains low and therefore the mixture will have excellent formability. Furthermore, the small surface area of the soft magnetic alloy powder also leads to excellent pressure transmission property during press forming, and consequently the press tonnage can be lowered, which is effective in prevention of damage to conductors of coil components, especially those having internal conductors.

Among the coil components manufactured from soft magnetic metal powders, the so-called composite coil components—that is, coil components that each have a coil part and a core part in which the coil part is embedded, where the core part contains a soft magnetic metal powder and a resin—benefit greatly from the aforementioned advantages of the first embodiment and second embodiment, meaning that the components will offer excellent magnetic properties, durability, and reliability, and will also permit reduction in component size. Additionally, performance enhancement and size reduction of circuit boards carrying such coil components are also possible. Accordingly, a coil component and a circuit board, both representing preferred modes of the present invention, are explained below as the third embodiment and fourth embodiment, respectively.

Coil Component

The coil component pertaining to the third embodiment of the present invention (hereinafter also referred to simply as "third embodiment") is a coil component that includes a coil part constituted by a metal conductor and a magnetic base body containing soft magnetic alloy grains, characterized in that the soft magnetic alloy grains are soft magnetic alloy grains constituting the soft magnetic alloy powder pertaining to the first embodiment.

As for the placement of the coil part, it may be embedded in the magnetic base body. Or, it may be wound around the magnetic base body.

The magnetic base body contains soft magnetic alloy grains constituting the soft magnetic alloy powder pertaining to the first embodiment. These soft magnetic alloy grains have shapes like those illustrated in FIG. 1, and can exist at a high filling rate in the magnetic base body as mentioned earlier.

The structure of the magnetic base body may be such that it contains a resin in addition to soft magnetic alloy grains, and that its shape is retained by the action of the resin. Or, its shape may be retained by bonds between soft magnetic alloy grains through the aforementioned oxide films.

Figure 2:
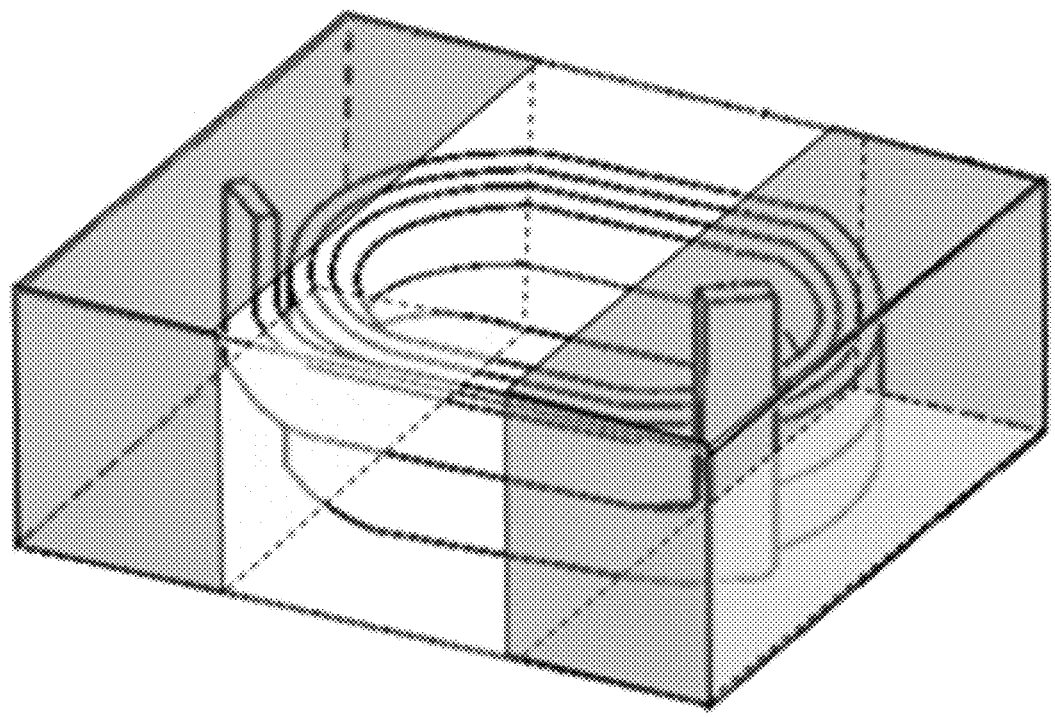
FIG. 2 is a drawing explaining a structural example of a composite coil component pertaining to an embodiment of the present invention
Figure 3A:
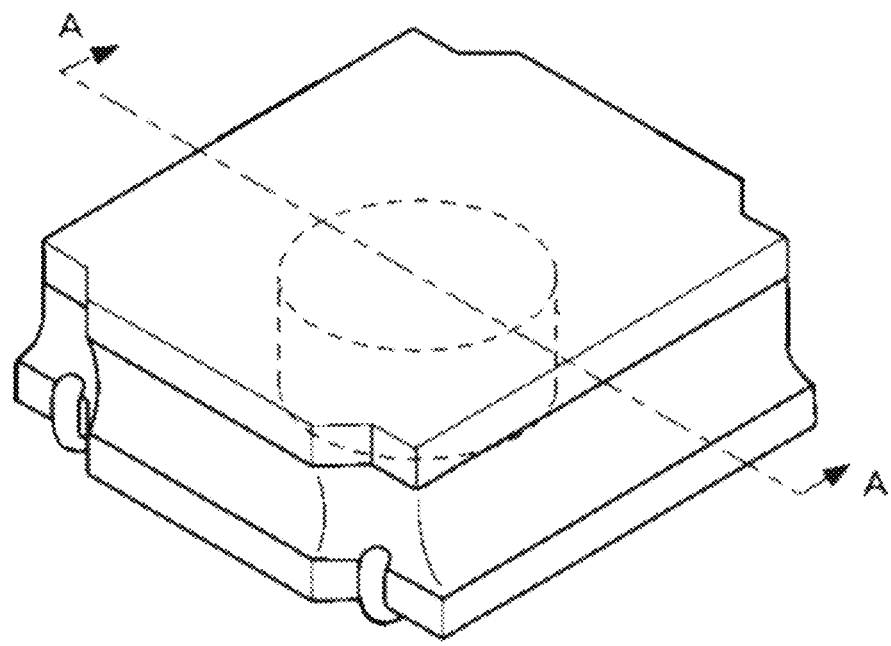
FIGS. 3A to 3B are drawings explaining a structural example of a wound coil component pertaining to an embodiment of the present invention (FIG. 3A: General perspective view, FIG. 3B: View of cross-section A-A in FIG. 3A)
Figure 3B:
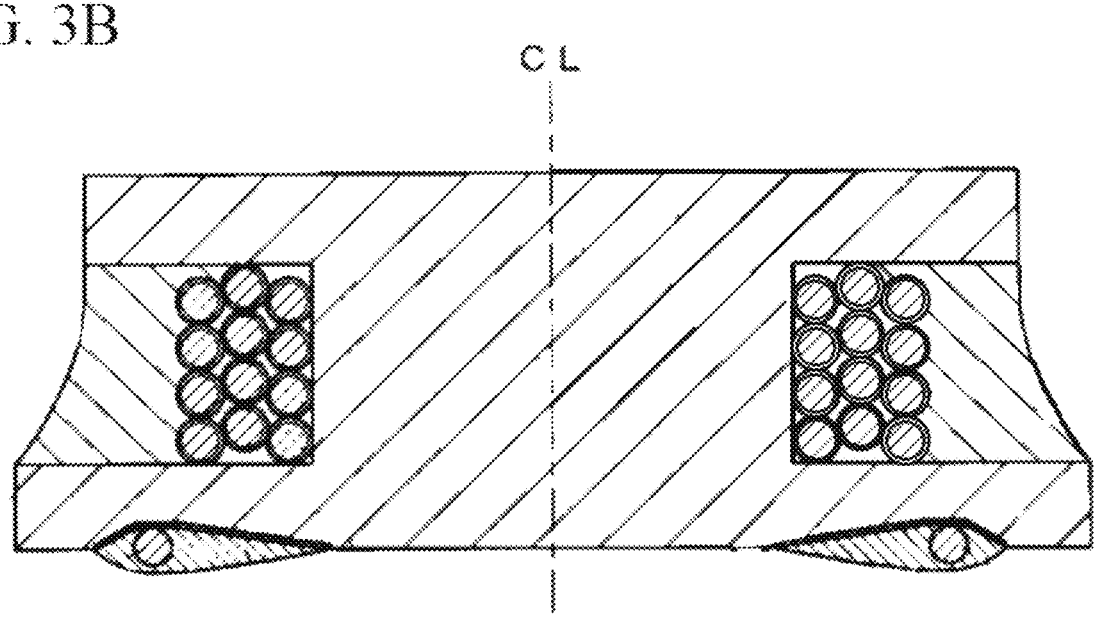
Figure 4A:
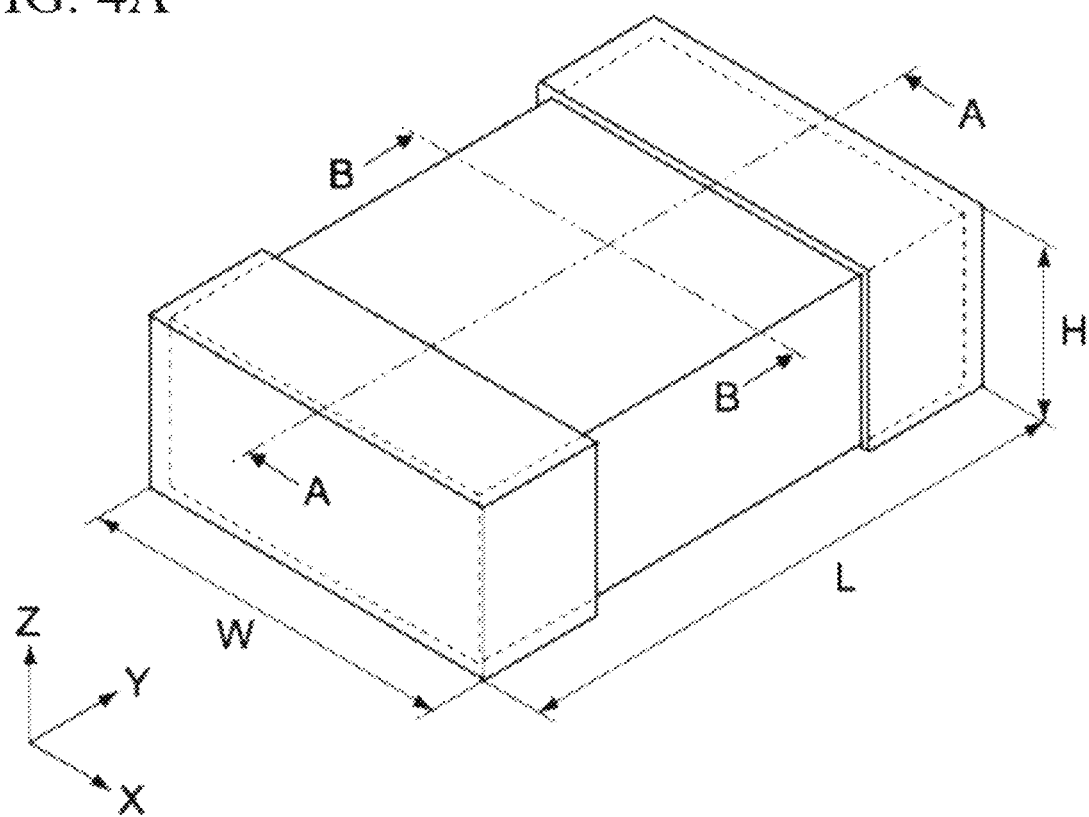
FIGS. 4A to 4B are drawings explaining a structural example of a multilayer coil component pertaining to an embodiment of the present invention (FIG. 4A: General perspective view, FIG. 4B: View of cross-section B-B in FIG. 4A)
Figure 4B:
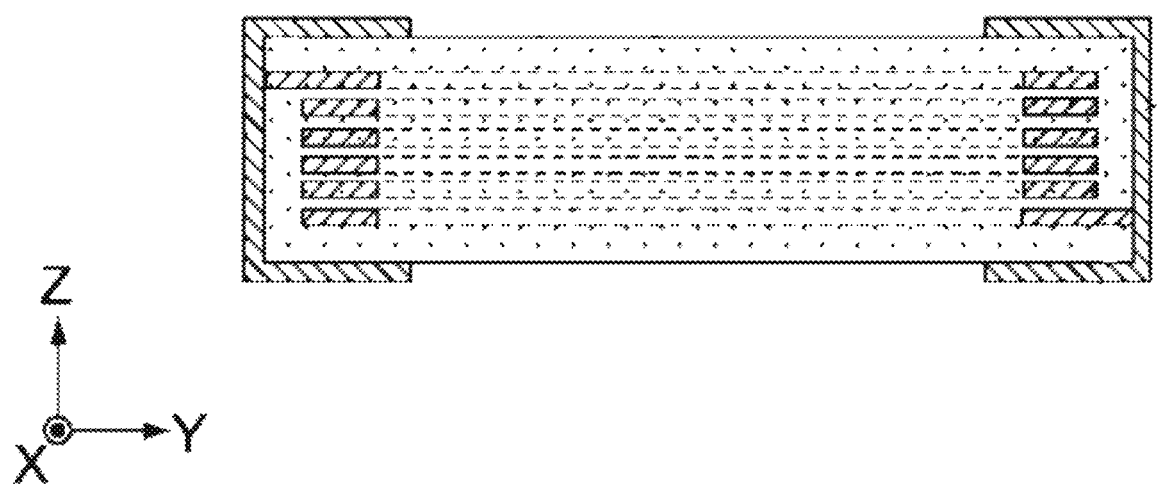
Figure 5:
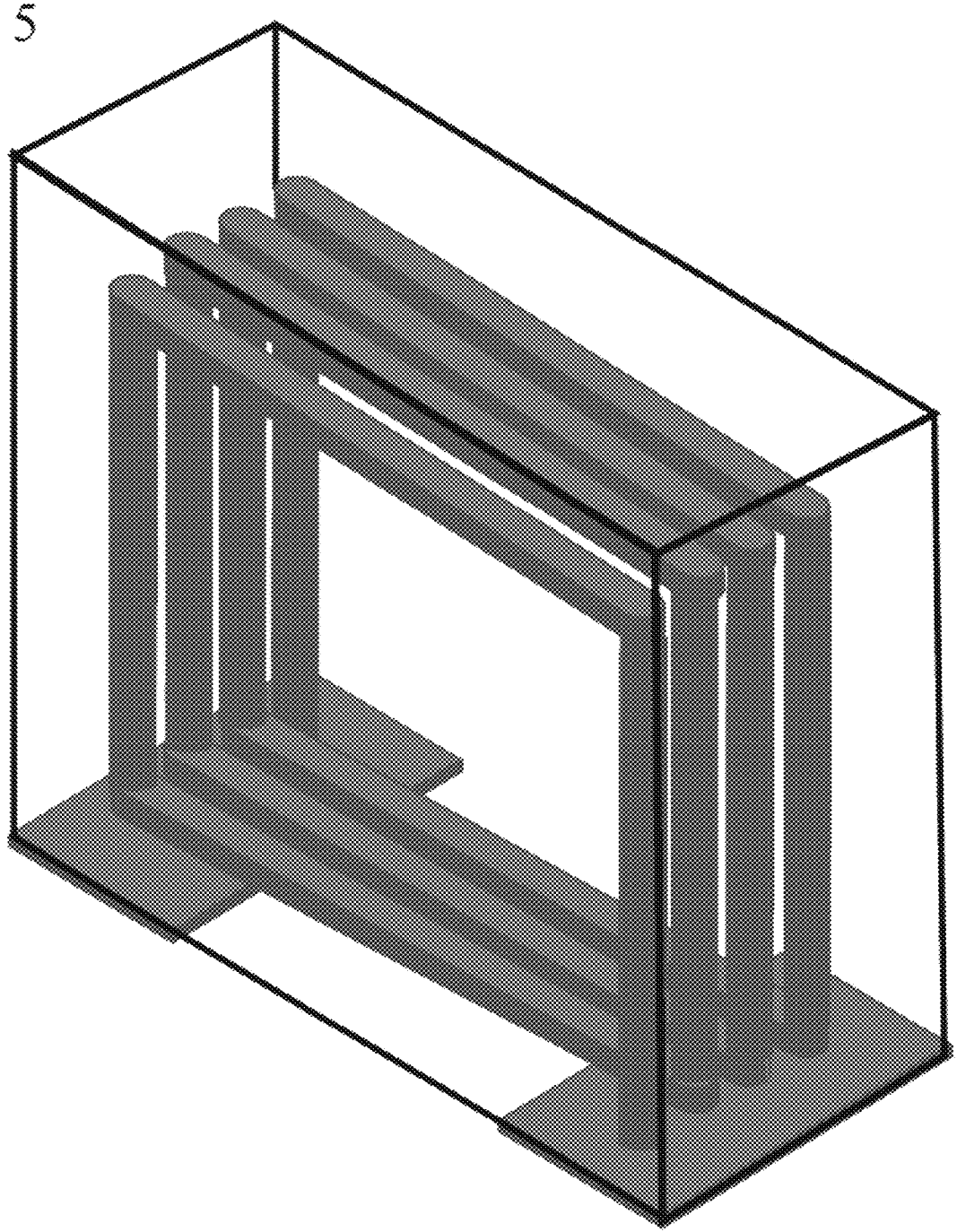
FIG. 5 is a drawing explaining a structural example of a thin-film coil component pertaining to an embodiment of the present invention

Examples of the third embodiment include, for example, a composite coil component such as the one shown in FIG. 2, a wound coil component such as the one shown in FIGS. 3A to 3B, a multilayer coil component such as the one shown in FIGS. 4A to 4B, and a thin-film coil component such as the one shown in FIG. 5.

As for the method for manufacturing the third embodiment, in the case of a composite coil component, for example, it is typically obtained by mixing a soft magnetic alloy powder with a resin to prepare a mixture, and then introducing the mixture into a metal die or other mold in which a hollow coil has been placed beforehand, followed by press-forming and curing of the resin.

The soft magnetic alloy powder to be used was described above and is not explained.

The resin to be used is not limited in type, so long as it can bond the soft magnetic metal powder grains together to form and retain a shape, and any of various resins such as epoxy resins, silicone resins, etc., may be used. The use quantity of resin is not limited in any way, either, and may be 1 to 10 parts by mass relative to 100 parts by mass of soft magnetic alloy powder, for example. In the third embodiment, use of a soft magnetic alloy powder offering excellent flowability allows for reduction in the use quantity of resin and increase in the percentage of soft magnetic alloy powder, and in this respect the use quantity of resin is preferably 3 parts by mass or less relative to 100 parts by mass of soft magnetic alloy powder.

The methods for mixing the soft magnetic alloy powder with the resin, and introducing the mixture into a mold, are not limited in any way, either, and a method of introducing a liquid mixture produced by kneading the two, as well as a method of introducing into a mold a granulated powder of a soft magnetic alloy whose surface has been coated with a resin, may be adopted, among others. Additionally, as a method for introducing the mixture into a mold and performing press-forming at the same time, one whereby the mixture is formed into a sheet and introduced into a mold by a press machine may be adopted.

The press-forming temperature and tonnage are not limited in any way, either, and may be determined as deemed appropriate according to the material and shape of the hollow coil placed in the mold, flowability of the soft magnetic metal powder introduced, and the type and quantity of the resin introduced, and the like.

The resin curing temperature, too, may be determined as deemed appropriate according to the resin used.

The magnetic base body pertaining to the third embodiment may be formed by press-forming a mixture of soft magnetic alloy powder and resin, and then heat-treating the obtained compact at a temperature higher than the resin curing temperature. In this case, the heat treatment breaks down the resin and also allows oxide films to grow on the surfaces of the soft magnetic alloy grains, thereby causing the soft magnetic alloy grains to bond together via the oxide films. It should be noted that, while the resin component will break down almost entirely due to the heat treatment, carbon may partially remain.

When a wire is wound around the magnetic base body thus obtained, a wound coil component can be obtained. A wound coil component is also one example of the coil component in the third embodiment.

Also, when the coil component is a multilayer coil component, it may be manufactured using the sheet method. As for the procedure under the sheet method, first a soft magnetic alloy powder is mixed with a resin to prepare a mixture, which is then applied in a sheet form using the doctor blade method, etc., and the sheet is cut, after which via holes are created at prescribed positions using a laser, etc., and internal patterns are printed at prescribed positions. Next, sheets that have been prepared in this manner are stacked in a prescribed order and then thermally compressed to obtain a laminate. Next, if necessary, the laminate is cut to the sizes of individual components using a dicer, laser cutting machine, or other cutting machine. Lastly, each of these laminates is heat-treated to obtain a multilayer coil component. A multilayer coil component is also one example of the coil component in the third embodiment.

Furthermore, when the coil component is a thin-film coil component, photolithography may be adopted. A thin-film coil component is also one example of the coil component of the third embodiment.

It goes without saying that, in addition to the manufacturing methods illustrated above, any known manufacturing method may be adopted according to the shape of the coil component, etc.

The composite coil component mentioned above as an example of the third embodiment uses, as the soft magnetic metal powder, one offering excellent flowability; accordingly, the filling rate of soft magnetic metal can be increased and a core of high magnetic permeability can be obtained. As a result, the element volume needed to obtain the same inductance can be reduced, which allows for size reduction of the coil component. Also, the composite coil component cited as an example of the third embodiment can be formed at a lower press tonnage during manufacturing, which makes the embedded hollow coil less prone to damage, leading to improved durability and reliability.

Circuit Board

The circuit board pertaining to the fourth embodiment of the present invention (hereinafter also referred to simply as "fourth embodiment") is a circuit board on which the coil component pertaining to the third embodiment is mounted.

The structure of the circuit board, etc., is not limited in any way, and whatever is appropriate for the purpose may be adopted.

The fourth embodiment permits performance enhancement and size reduction as a result of use of the coil component pertaining to the third embodiment.

EXAMPLES

The present invention is explained more specifically below using examples; it should be noted, however, that the present invention is not limited to these examples.

Example 1

(Manufacturing of Soft Magnetic Alloy Powder)

First, a material powder of soft magnetic alloy having a composition of Fe-3.5Si-1.5Cr (the numerical values indicate percent by mass) and an average grain size of 4.0 μm was put in a container made of zirconia, and placed in a vacuum heat treatment furnace.

Next, the interior of the furnace was evacuated to an oxygen concentration of 100 ppm, and then its temperature was raised to 700° C. at a rate of rise in temperature of 5° C./min, and held at that level for 1 hour to perform heat treatment, after which the furnace was cooled to room temperature, to obtain the soft magnetic alloy powder pertaining to Example 1.

(Measurement of Element Distributions in Soft Magnetic Alloy Powder)

Figure 6:
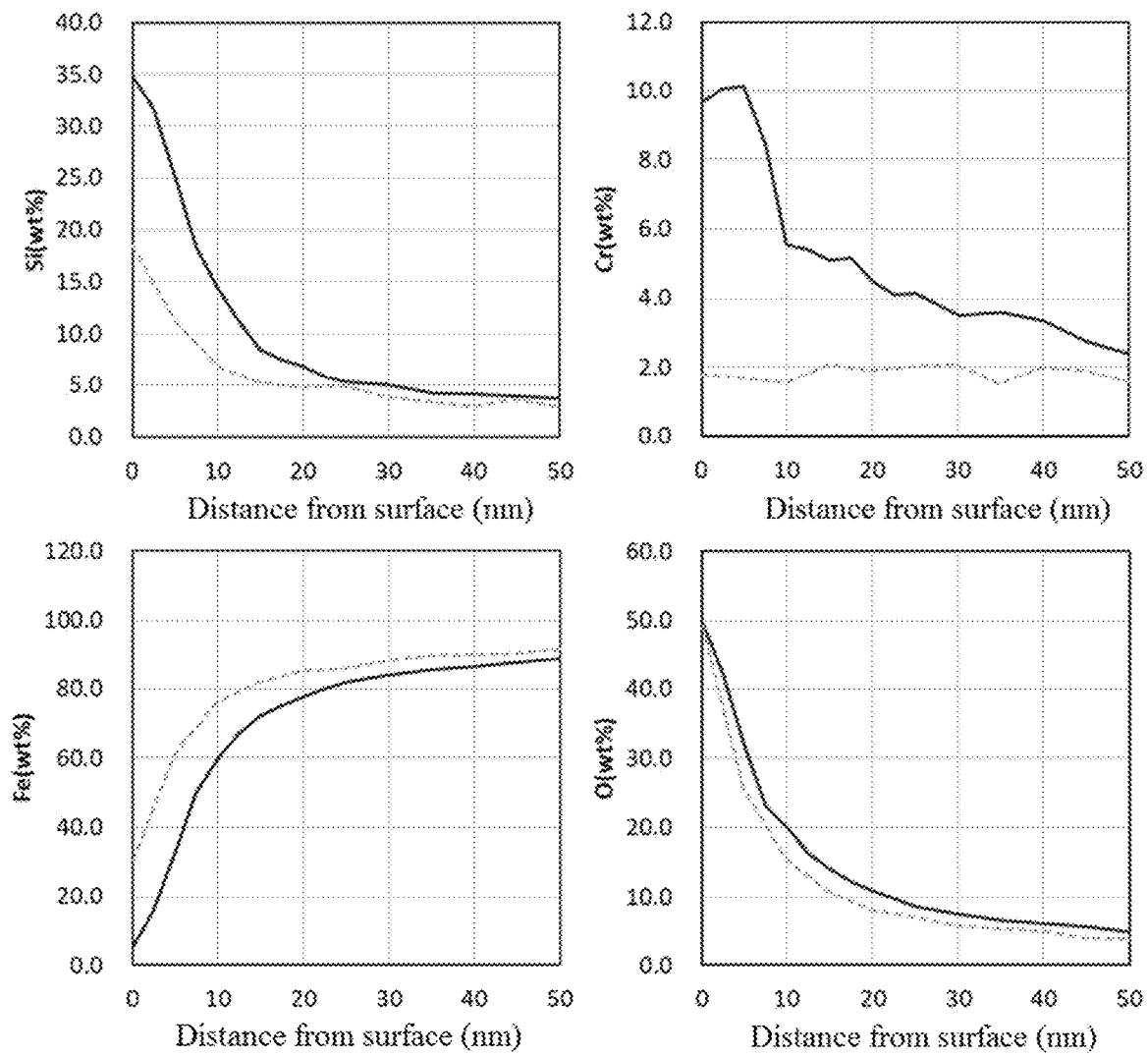
FIG. 6 is measured results of concentration distributions of respective elements in a soft magnetic alloy powder pertaining to an embodiment of the present invention (Example 1) and a soft magnetic alloy powder not meeting the requirements of the present invention (Comparative Example 1) (Solid line: Example 1, Dotted line: Comparative Example 1)

When the obtained soft magnetic alloy powder was measured for percentage by mass of each element in the alloy part and oxide film according to the aforementioned method, the concentration distributions shown by the solid lines in FIG. 6 were obtained, confirming that an oxide film containing Si and Cr at higher percentages by mass than those in the alloy part was provided on the surface of each grain constituting the alloy powder. Also, when the distribution of Si/Cr ratios by mass was calculated from the obtained concentration distributions, the result shown by the solid line in FIG. 7 was obtained. The Si/Cr ratio by mass at the topmost surface of the grain was 3.62.

As is evident from the solid lines in FIG. 6, the content of O increases, and the content of Cr also begins to increase continuously, in the oxide film from the interior side (alloy part side) toward the exterior side of the grain. Also, the content of Si begins to increase continuously from the interior side, starting before the region where the content of Cr begins to increase. As just described, the presence of Cr suppresses excessive oxidation of the alloy part and, as a result, allows the oxide film to be made thinner. Also, that the content of Si is higher than that of Cr allows the insulating property to be increased. This is because oxides of Si have higher insulating resistances than do oxides of Cr. Here, the content of Si is higher than that of Cr throughout the oxide film. Also, Cr and Si are present over the entire oxide film. Additionally, this oxide film exhibits a continuous decrease in the content of Fe from the alloy part toward the exterior side. These things also contribute to the oxide film having high insulating property and small surface concavities and convexities. Furthermore, it is clear from the continuous distributions of Cr, Si, and Fe that this oxide film has high adhesion to the alloy part, the result of which is prevention of damage that would otherwise occur easily due to pressure, etc.

(Measurement of Specific Surface Area and Average Grain Size of Soft Magnetic Alloy Powder)

When the obtained soft magnetic alloy powder was measured for specific surface area S and average grain size $D_{50}$ according to the aforementioned methods, the results were S=0.45 m$^2$/g and $D_{50}$=4.0 μm.

(Flowability Evaluation of Soft Magnetic Alloy Powder)

The obtained soft magnetic alloy powder was evaluated for flowability based on tap density $d_T$. As for the measurement of tap density, the soft magnetic alloy powder was introduced by a prescribed mass into a graduated cylinder made of glass, and then tapping and calculation of bulk density by means of reading the fill height (bulk) of the powder, were repeated, and when the change in bulk density per 10 tappings became 5% or less, the corresponding value was adopted as the tap density. The obtained tap density was 4.5 g/cm$^3$.

(Characteristics Evaluations of Magnetic Body)

The characteristics of the obtained soft magnetic alloy powder formed into a magnetic body, were evaluated based on the specific magnetic permeability of a toroidal coil as well as the volume resistivity and dielectric breakdown voltage of a disk-shaped sample.

The toroidal coil for evaluation was produced according to the following procedure. First, the soft magnetic alloy powder was mixed under agitation with 1.2 percent by mass of an acrylic binder, to prepare a compacting material. Next, this compacting material was introduced into a die having a compacting space corresponding to a toroid of 8 mm in outer diameter and 4 mm in inner diameter, and then uniaxially press-formed at a tonnage of 8 t/cm$^2$, to obtain a compact of 1.3 mm in thickness. Next, the obtained compact was placed for 1 hour in a thermostatic chamber kept at 150° C. to cure the binder, and then heated to 300° C. in a superheated steam furnace to remove the binder by means of thermal decomposition. Next, using a quartz furnace, the compact was heat-treated at 800° C. for 1 hour in an atmosphere of 800 ppm in oxygen concentration, to obtain a toroidal core. Lastly, a coil constituted by a urethane-coated copper wire of 0.3 mm in diameter was wound around the obtained toroidal core by 20 turns, and the result was used as an evaluation sample.

The obtained evaluation sample was measured for specific magnetic permeability at a frequency of 10 MHz using an LCR meter (4285A, manufactured by Agilent Technologies, Inc.) as a measuring device. The obtained specific magnetic permeability was 25.

The disk-shaped sample for evaluation was produced according to the following procedure. First, the soft magnetic alloy powder was mixed under agitation with 1.2 percent by mass of an acrylic binder, to prepare a compacting material. Next, this compacting material was introduced into a die having a disk-shaped compacting space of 7 mm in inner diameter, and then uniaxially press-formed at a tonnage of 8 t/cm², to obtain a compact of 0.5 to 0.8 mm in thickness. Next, the obtained compact was placed for 1 hour in a thermostatic chamber kept at 150° C. to cure the binder, and then heated to 300° C. in a superheated steam furnace to remove the binder by means of thermal decomposition. Next, using a quartz furnace, the compact was heat-treated at 800° C. for 1 hour in an atmosphere of 800 ppm in oxygen concentration, to obtain a disk-shaped sample. Lastly, the obtained disk-shaped sample was sputtered all over on both sides to form Au films, and the result was used as an evaluation sample.

The obtained evaluation sample was measured for volume resistivity according to JIS-K6911. Using the Au films formed on both sides of the sample as electrodes, voltage was applied between the electrodes to an electric field strength of 60 V/cm and the resistance value was measured, and the volume resistivity was calculated from this resistance value. The volume resistivity of the evaluation sample was 103 MΩ·cm.

Also, the dielectric breakdown voltage of the obtained evaluation sample was measured by using the Au films formed on both sides of the sample as electrodes, applying voltage between the electrodes, and measuring the current value. Current values were measured by gradually raising the applied voltage, and when the current density calculated from the measured current value became 0.01 A/cm², the electric field strength calculated from the applicable voltage was taken as the breakdown voltage. The dielectric breakdown voltage of the evaluation sample was 0.0047 MV/cm.

Comparative Example 1

The material powder of soft magnetic alloy used in Example 1 was adopted as the soft magnetic alloy powder pertaining to Comparative Example 1.

When the soft magnetic alloy powder was measured for percentage by mass of each element in the alloy part and oxide film according to the same method in Example 1, the concentration distributions shown by the dotted lines in FIG. 6 were obtained. In the oxide film, the percentage by mass of Si was higher than that in the alloy part, but the percentage by mass of Cr was similar to the alloy part.

Figure 7:
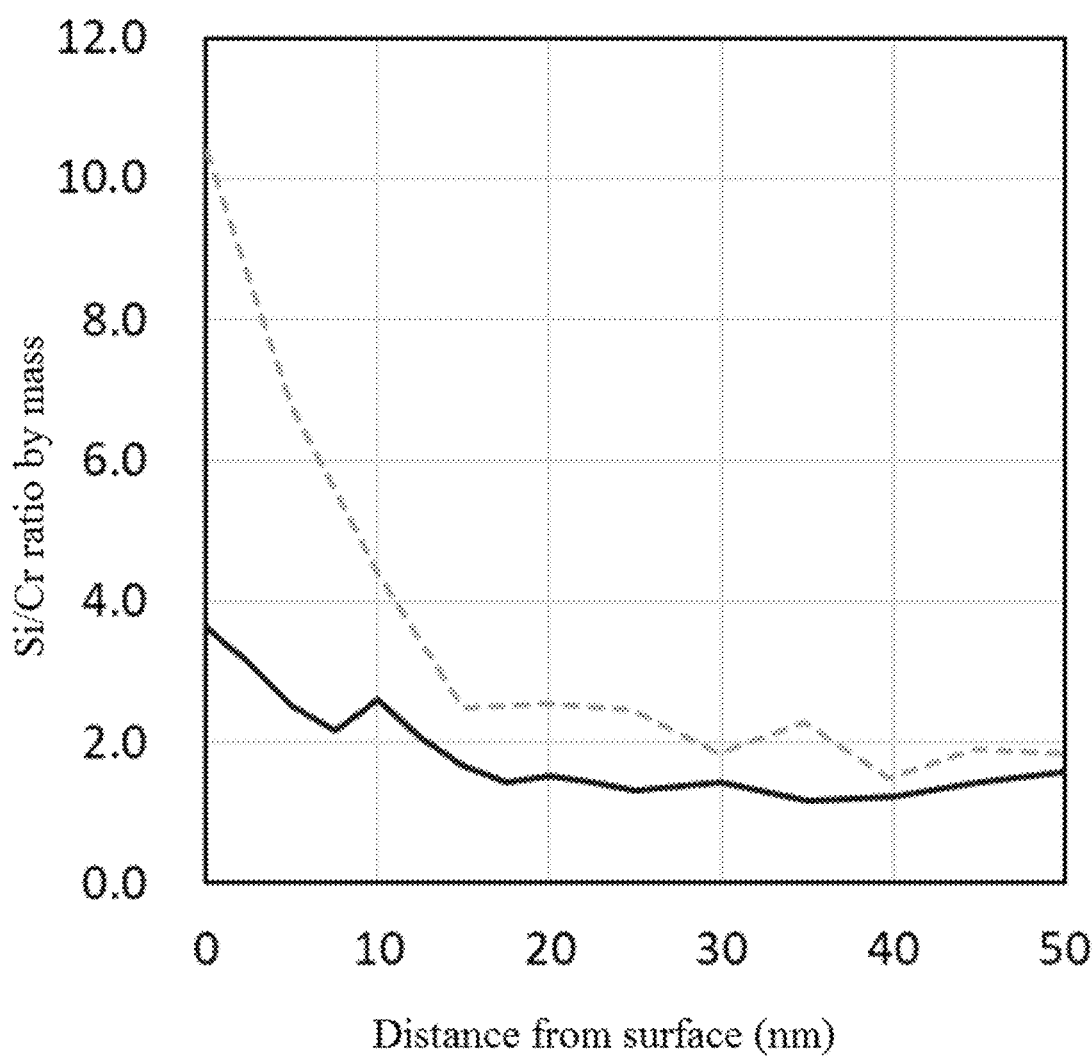
FIG. 7 is calculated results of distributions of Si/Cr ratios by mass in a soft magnetic alloy powder pertaining to an embodiment of the present invention (Example 1) and a soft magnetic alloy powder not meeting the requirements of the present invention (Comparative Example 1) (Solid line: Example 1, Dotted line: Comparative Example 1)

Also, when the distribution of Si/Cr ratios by mass was calculated from the obtained concentration distributions, the result shown by the dotted line in FIG. 7 was obtained. The Si/Cr ratio by mass at the topmost surface of the grain was 10.40. Comparison of Example 1 (solid line) and Comparative Example 1 (dotted line) in FIG. 7 reveals that the Si/Cr ratios by mass on the grain surface fell within a preferred range due to the heat treatment.

Also, when this soft magnetic alloy powder was measured for specific surface area S, average grain size $D_{50}$, and tap density $d_T$ according to the same methods in Example 1, the results were S=0.58 m²/g, $D_{50}$=4.0 μm, and $d_T$=3.7 g/cm³.

Furthermore, when the characteristics of this soft magnetic alloy powder, formed into a magnetic body, were evaluated according to the same methods in Example 1, the specific magnetic permeability was 22, the volume resistivity was 0.2 MΩ·cm, and the dielectric breakdown voltage was 0.0018 MV/cm.

Example 2

The soft magnetic alloy powder pertaining to Example 2 was obtained in the same manner as in Example 1, except that a material powder of 2.2 μm in average grain size was used and the oxygen concentration of the heat treatment atmosphere was adjusted to 5 ppm.

When the obtained soft magnetic alloy powder was measured for percentage by mass of each element in the alloy part and oxide film according to the same method in Example 1, concentration distributions similar to those in Example 1 presented.

Also, when the obtained soft magnetic alloy powder was measured for specific surface area S, average grain size $D_{50}$, and tap density $d_T$ according to the same methods in Example 1, the results were S=0.80 m²/g, $D_{50}$=2.2 μm, and $d_T$=3.9 g/cm³.

Furthermore, when the characteristics of the obtained soft magnetic alloy powder, formed into a magnetic body, were evaluated for specific magnetic permeability and volume resistivity according to the same methods in Example 1, the specific magnetic permeability was 22 and the volume resistivity was 100 MΩ·cm.

(Measurement of Oxide Thickness)

In this example, the thickness of the oxide film was measured according to the aforementioned method, regarding the obtained soft magnetic alloy powder. The thickness of the obtained oxide film was 30 nm.

(Evaluation of Filling Properties in Magnetic Body)

In this example, the filling properties of the obtained soft magnetic alloy powder in a magnetic body were evaluated, in addition to the aforementioned evaluations, based on the filling rate of a disk-shaped sample and the density ratio of the flange part, to the axis part, of a drum core-shaped sample.

The disk-shaped sample was prepared according to the same method used for the disk-shaped sample in Example 1.

The obtained disk-shaped sample was measured for outer diameter and thickness to calculate the volume (measured volume). Also, the soft magnetic alloy powder used in the preparation of the disk-shaped sample was measured for true density according to the pycnometer method, and the mass of the disk-shaped sample was divided by the value of true density to calculate the volume (ideal volume) of a magnetic body to be formed whose disk-shaped sample would have a filling rate of soft magnetic alloy powder corresponding to 100 percent by volume. Then, this ideal volume was divided by the measured volume to calculate the filling rate. The obtained filling rate was 80.5 percent by volume.

The drum core-shaped sample was prepared according to the same procedure used for the disk-shaped sample, except that the die used for compacting was changed to one having a compacting space for the axis part and a compacting space for the flange part, to obtain a drum core-shaped sample whose axis part was 1.6 mm×1.0 mm×1.0 mm in size and whose flange part had a thickness of 0.25 mm.

The density ratio of the flange part, to the axis part, of the obtained drum core-shaped sample was calculated by collecting measurement samples from the axis part and flange part of the sample, respectively, and measuring the volumes of the respective samples according to the fixed volume expansion method, while also measuring the masses of the respective samples, and then calculating the densities of the respective parts from the measured values to obtain the ratio thereof. With this sample, whose flange part and axis part are made from the same type of material, the density ratio equals the ratio of filling rates. The obtained density ratio was 0.93.

Comparative Example 2

The material powder of soft magnetic alloy used in Example 2 was adopted as the soft magnetic alloy powder pertaining to Comparative Example 2.

When the soft magnetic alloy powder was measured for percentage by mass of each element in the alloy part and oxide film according to the same method in Example 1, concentration distributions similar to those in Comparative Example 1 presented.

Also, when this soft magnetic alloy powder was measured for specific surface area S, average grain size $D_{50}$, and tap density $d_T$ according to the same methods in Example 1, the results were S=1.01 m$^2$/g, $D_{50}$=2.2 μm, and $d_T$=3.2 g/cm$^3$.

Furthermore, when the characteristics of this soft magnetic alloy powder, formed into a magnetic body, were evaluated for specific magnetic permeability and volume resistivity according to the same methods in Example 1, the specific magnetic permeability was 16 and the volume resistivity was 0.5 MΩ·cm.

When the thickness of the oxide film in the soft magnetic alloy powder pertaining to this comparative example was measured according to the same method in Example 2, the result was 2 nm.

Also, when the filling properties of the soft magnetic alloy powder in a magnetic body were evaluated according to the same method in Example 2, the filling rate was 78.8 percent by volume and the density ratio was 0.90.

Examples 3 to 6

The soft magnetic alloy powders pertaining to Examples 3 to 6 were obtained in the same manner as in Example 1, except that a material powder of a different grain size was used.

When the obtained soft magnetic alloy powders were measured for percentage by mass of each element in the alloy part and oxide film according to the same method in Example 1, concentration distributions similar to those in Example 1 presented for all examples.

Also, the obtained soft magnetic alloy powders were measured for specific surface area S, average grain size $D_{50}$, and tap density $d_T$ according to the same methods in Example 1. The obtained results are summarized and shown in Table 1.

Comparative Examples 3 to 6

Soft magnetic alloy powders identical to the one in Comparative Example 1, except having different grain sizes, were prepared and adopted as the soft magnetic alloy powders pertaining to Comparative Examples 3 to 6.

When the respective soft magnetic alloy powders were measured for percentage by mass of each element in the alloy part and oxide film according to the same method in Comparative Example 1, concentration distributions similar to those in Example 1 presented for all examples.

Also, these soft magnetic alloy powders were measured for specific surface area S, average grain size $D_{50}$, and tap density $d_T$ according to the same methods in Example 1. The obtained results are summarized and shown in Table 1.

Figure 8:
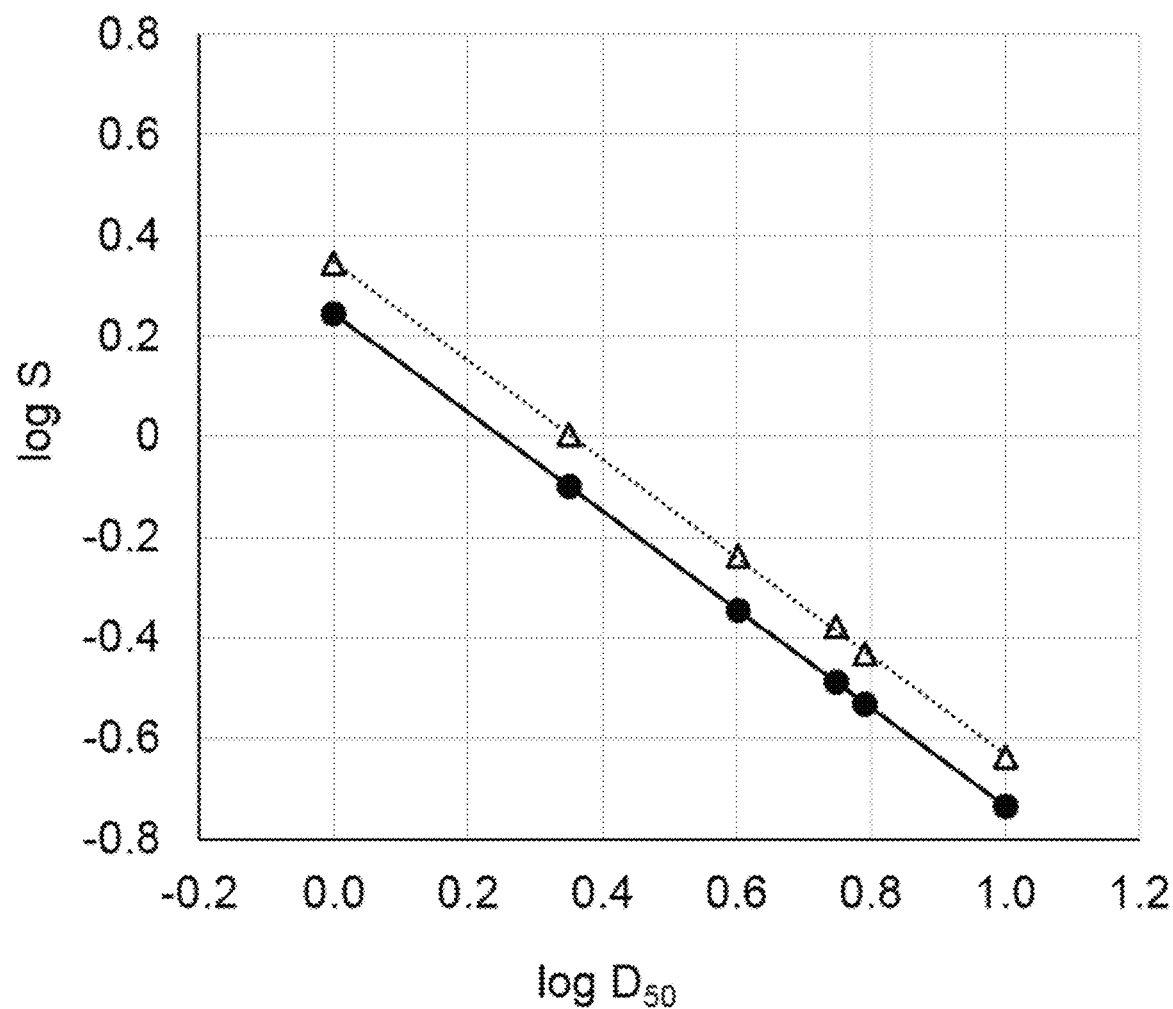
FIG. 8 is a graph showing the relationships, between the common logarithm of specific surface area S ($m^2/g$) and the common logarithm of average grain size $D_{50}$ (μm), regarding soft magnetic alloy powders pertaining to embodiments of the present invention (Examples 1 to 6) and soft magnetic alloy powders not meeting the requirements of the present invention (Comparative Examples 1 to 6) (Solid black circles—solid line: Examples 1 to 6, Outlined white triangles—dotted line: Comparative Examples 1 to 6)

The measured results of specific surface areas S, average grain size $D_{50}$, and tap density $d_T$ of the soft magnetic alloy powders pertaining to Examples 1 to 6 and Comparative Examples 1 to 6 are summarized and shown in Table 1. Also, regarding these examples and comparative examples, a graph whose vertical axis represents the common logarithm of specific surface area S and whose horizontal axis represents the common logarithm of average grain size $D_{50}$, is shown in FIG. 8. In FIG. 8, the solid black circles and solid line represent the examples, while the outlined white triangles and dotted line represent the comparative examples.

TABLE 1

| | Average grain size [μm] | BET value [m$^2$/g] | Tap density [g/cm$^3$] | | Average grain size [μm] | BET value [m$^2$/g] | Tap density [g/cm$^3$] |
|---|---|---|---|---|---|---|---|
| Example 1 | 4.0 | 0.45 | 4.5 | Comparative Example 1 | 4.0 | 0.58 | 3.7 |
| Example 2 | 2.2 | 0.80 | 3.9 | Comparative Example 2 | 2.2 | 1.01 | 3.2 |
| Example 3 | 1.0 | 1.76 | 3.3 | Comparative Example 3 | 1.0 | 2.22 | 2.7 |
| Example 4 | 5.6 | 0.33 | 4.7 | Comparative Example 4 | 5.6 | 0.42 | 3.9 |
| Example 5 | 6.2 | 0.29 | 4.8 | Comparative Example 5 | 6.2 | 0.37 | 4.0 |
| Example 6 | 10.0 | 0.18 | 5.0 | Comparative Example 6 | 10.0 | 0.23 | 4.2 |

It is clear from Table 1 that the soft magnetic alloy powders pertaining to the examples have smaller specific surface areas S and higher tap densities $d_T$ than those in the comparative examples having the same average grain size $D_{50}$. From these results, it is considered that the soft magnetic alloy powder pertaining to each example—because the oxide film present on the surface of each grain constituting the powder contains higher percentages by mass of Si, Cr, and Al than does the alloy part, and also because the content of Si, expressed in percentage by mass, is higher than the total content of Cr and Al—has a smooth grain surface with fewer concavities and convexities, which leads to flowability superior to that of any soft magnetic alloy powder of the same grain size that does not have the oxide film.

In FIG. 8 that organizes the relationships between specific surface areas S and average grain sizes $D_{50}$, the examples (solid black circles), and the comparative examples (outlined white triangles), are plotted along the same straight lines, respectively, where the equation representing the straight line pertaining to the examples (solid line) turned out to be $\log(S)=-0.98\{\log(D_{50})\}+0.2455$, while the equation representing the straight line pertaining to the comparative examples (dotted line), $\log(S)=-0.9812\{\log(D_{50})\}+0.3491$. From these results, it can be argued that the measured results of those soft magnetic alloy powders that were given the same treatment and thus had the same surface condition appeared on the same straight line. Also, judging from the fact that the straight lines both have a slope of −0.98, and that the straight line representing the examples is positioned below that representing the comparative examples, it is considered that the smoothness of the grain surface manifests as the intercept of the graph, and the smaller this intercept, the smoother the surface and the more superior the flowability of the powder becomes. Based on the foregoing, it is considered that a soft magnetic alloy powder offering superior flowability can be obtained as a powder that appears on a straight line with a slope of −0.98 and having as small an intercept as possible, when the common logarithm of specific surface area S and the common logarithm of average grain size $D_{50}$ are plotted.

Comparative Example 7

The soft magnetic alloy powder pertaining to Comparative Example 2 was heat-treated at 750° C. for 1 hour in atmosphere to obtain the soft magnetic alloy powder pertaining to Comparative Example 7.

When the obtained soft magnetic alloy powder was measured for percentage by mass of each element in the alloy part and the oxide film according to the same method in Example 1, it was confirmed that Cr was the element contained most in the oxide film.

When the characteristics of this soft magnetic alloy powder, formed into a magnetic body, were evaluated for specific magnetic permeability and volume resistivity according to the same methods in Example 1, the specific magnetic permeability was 11 and the volume resistivity was 2 MΩ·cm.

Also, when the obtained soft magnetic alloy powder was measured for thickness of oxide film according to the same method in Example 2, it was 100 nm.

Furthermore, when the filling properties of the soft magnetic alloy powder in a magnetic body were evaluated according to the same methods in Example 2, the filling rate was 77.1 percent by volume and the density ratio was 0.88.

With respect to Examples 1 and 2 as well as Comparative Examples 1, 2 and 7, the measured results of specific magnetic permeabilities, volume resistivities, and dielectric breakdown voltages of the magnetic bodies produced from the soft magnetic alloy powders are summarized and shown in Table 2. Also, with respect to Examples 2 and Comparative Examples 2 and 7, the measured results of oxide film thicknesses on the surfaces of the grains constituting the soft magnetic alloy powders, of filling rates of the soft magnetic alloy powders in disk-shaped samples, and of flange part/axis part density ratios in drum core-shaped samples, are summarized and shown in table 3.

TABLE 2

| | Specific magnetic permeability (at 10 MHz) | Resistivity [MΩ · cm] | Dielectric breakdown voltage [MV/cm] |
|---|---|---|---|
| Example 1 | 25 | 103 | 0.0047 |
| Comparative Example 1 | 22 | 0.2 | 0.0018 |
| Example 2 | 22 | 100 | — |
| Comparative Example 2 | 16 | 0.5 | — |
| Comparative Example 7 | 11 | 2 | — |

— indicates that measurement was not taken.

TABLE 3

| | Oxide film thickness [nm] | Filling rate [% by volume] | Flange/axis density ratio |
|---|---|---|---|
| Example 2 | 30 | 80.5 | 0.93 |
| Comparative Example 2 | 2 | 78.8 | 0.90 |
| Comparative Example 7 | 100 | 77.1 | 0.88 |

It is clear from Table 2 that the magnetic bodies in the examples, produced from the soft magnetic alloy powders with excellent flowability, are superior to those in the comparative examples in terms of magnetic properties and insulating property. In particular, comparison of Example 2 and Comparative Example 7, including Table 3, clearly shows that the oxide film formed on the grain surface in the example demonstrates excellent insulating property with a small thickness.

Also, it is clear from Table 3 that the soft magnetic alloy powders with excellent flowability in the examples allow for production of magnetic bodies in which the soft magnetic alloy grains are filled more evenly and at higher density. Based on this, it can be argued that the soft magnetic alloy powder proposed by the present invention, when made into a composite coil component having a coil part embedded in a core part, will provide a coil component that offers excellent magnetic properties owing to an even and high-density filling of the soft magnetic alloy grains.

Example 7

The soft magnetic alloy powder pertaining to Example 7 was obtained in the same manner as in Example 1, except that, as the material powder of soft magnetic alloy powder, one having a composition of Fe-3.5Si-0.5Al (the numerical values indicate percent by mass) and an average grain size of 5.0 μm was used and that the oxygen concentration of the heat treatment atmosphere was adjusted to 50 ppm.

Figure 9:
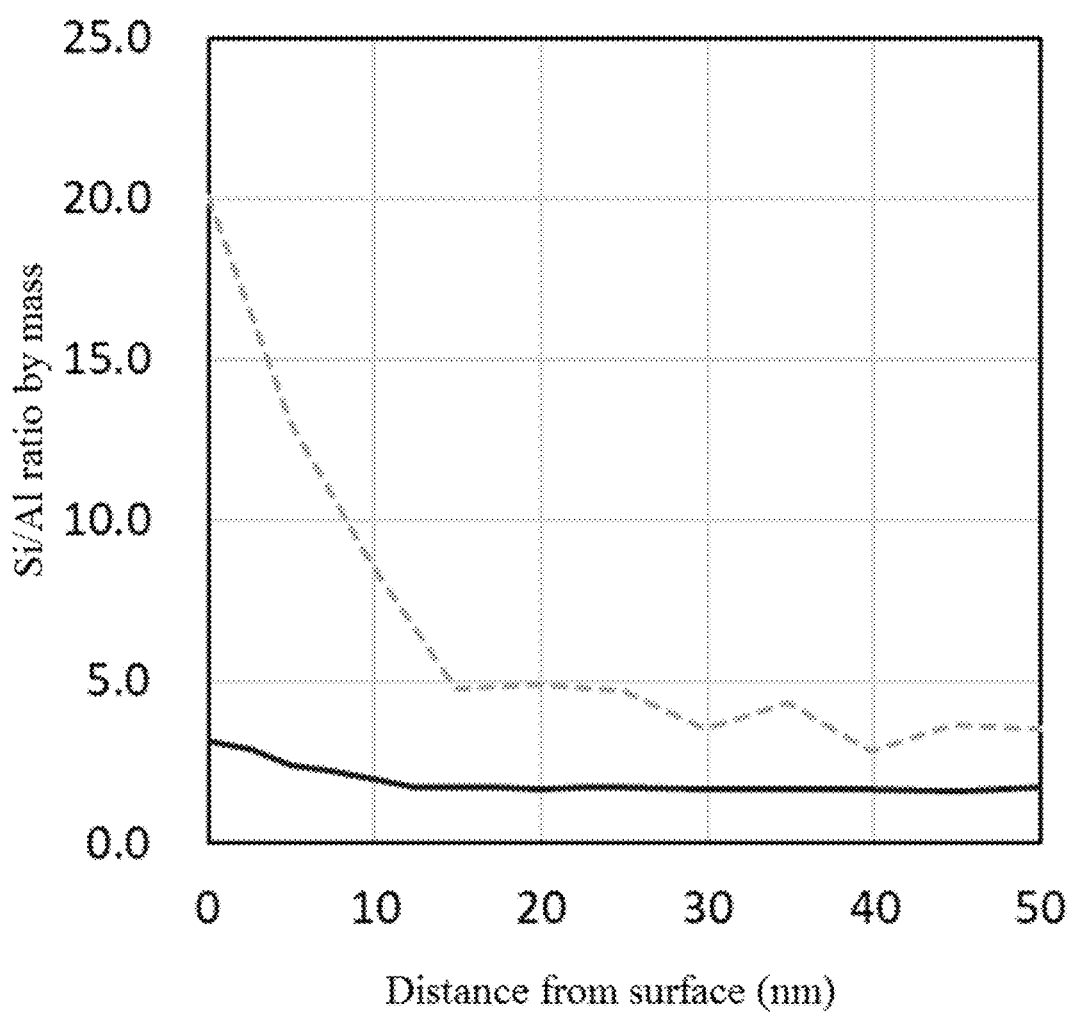
FIG. 9 is calculated results of distribution of Si/Al ratios by mass in a soft magnetic alloy powder pertaining to an embodiment of the present invention (Example 7) (Solid line: Example 7, Dotted line: Material powder)

When the obtained soft magnetic alloy powder was measured for percentage by mass of each element in the alloy part and oxide film according to the same method in Example 1, concentration distributions similar to those in Example 1 were obtained, confirming that an oxide film containing Si and Al at higher percentages by mass than those in the alloy part is provided on the surface of each grain constituting the alloy powder. Also, when the distribution of Si/Al ratios by mass was calculated from the obtained concentration distributions, the result shown by the solid line in FIG. 9 was obtained. Using the dotted line, the figure also indicates the distribution of Si/Al ratios by mass in the material powder before the heat treatment, for comparison. From this result, it is clear that the Si/Al ratios by mass on the grain surface fell within a preferred range due to the heat treatment. The Si/Al ratio by mass at the topmost surface of the grain after the heat treatment was 3.13.

Also, when this soft magnetic alloy powder was measured for specific surface area S, average grain size $D_{50}$, and tap density $d_T$ according to the same methods in Example 1, the results were S=0.49 m²/g, $D_{50}$=5.0 μm, and $d_T$=4.6 g/cm³.

Since the relationship of specific surface area S and average grain size $D_{50}$ satisfies Formula (1) mentioned above, it can be argued that the soft magnetic alloy powder pertaining to this example is constituted by grains having a smooth surface with fewer concavities and convexities. Also, because the tap density $d_T$ is higher than the level without heat treatment ($d_T$=4.0 g/cm³), it can be argued that the soft magnetic alloy powder pertaining to this example offers excellent flowability.

INDUSTRIAL APPLICABILITY

According to the present invention, a soft magnetic alloy powder having excellent flowability is provided. Since the soft magnetic alloy powder can be easily transferred or filled in dies in the process for manufacturing magnetic bodies and it blends well with resins, it is easy to handle, and in these respects, the present invention is useful. Additionally, according to a preferred mode of the present invention, a coil component that contains the soft magnetic alloy powder at a high filling rate can be formed at a low compacting pressure, which means that a coil component offering high magnetic properties, durability, and reliability are provided and the coil component, as well as the circuit board on which it is carried, can be reduced in size, and in these respects, too, the present invention is useful.

We claim:

1. A soft magnetic alloy powder containing Fe, Si, and at least one of Cr and Al, as constituent elements, wherein, on a surface of each grain constituting the alloy powder, an oxide film is formed, wherein:
 the oxide film contains Si, as well as at least one of Cr and Al, as constituent elements;
 the Si and the at least one of Cr and Al are contained at higher percentages by mass than those in an alloy part of the grain underneath the oxide film; and
 a content of the Si, expressed in percentage by mass, is higher than a total content of the at least one of Cr and Al.

2. The soft magnetic alloy powder according to claim 1, whose specific surface area S (m²/g) and average grain size $D_{50}$ (μm) satisfy Formula (1) below:

$$\log S \leq -0.98 \log D_{50} + 0.34 \qquad (1).$$

3. The soft magnetic alloy powder according to claim 1, wherein a Si/Cr ratio by mass or Si/Al ratio by mass at a topmost surface of the oxide film is in a range from 1 to 10.

4. The soft magnetic alloy powder according to claim 1, wherein a composition of the alloy part is such that Si is contained by 1 to 10 percent by mass, Cr or Al is contained by 0.2 to 2 percent by mass in total, and a remainder is Fe and unavoidable impurities.

5. The soft magnetic alloy powder according to claim 1, wherein:
 Fe, Si, and Al are contained as constituent elements; and
 a composition of the alloy part is such that Si is contained by 1 to 10 percent by mass, Al is contained by 0.2 to 1 percent by mass, and a remainder is Fe and unavoidable impurities.

6. The soft magnetic alloy powder according to claim 1, wherein Fe is detected at any given locations of the oxide film.

* * * * *